United States Patent
Engel et al.

(10) Patent No.: US 6,265,865 B1
(45) Date of Patent: *Jul. 24, 2001

(54) SINGLE UNITARY PLASTIC PACKAGE FOR A MAGNETIC FIELD SENSING DEVICE

(75) Inventors: Raymond W Engel, Southbridge, MA (US); Ravi Vig, Bow, NH (US); Jay Gagnon J Gagnon, Holden, MA (US)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/311,868

(22) Filed: May 14, 1999

Related U.S. Application Data

(63) Continuation of application No. 08/916,746, filed on Aug. 19, 1997, now Pat. No. 5,963,028.

(51) Int. Cl.⁷ .............................. G01R 33/06; H01L 43/00
(52) U.S. Cl. ..................... 324/207.2; 324/174; 324/251
(58) Field of Search ........................ 324/207.2, 207.21, 324/207.23, 207.24, 207.25, 251, 173, 174, 207.26, 252; 29/595; 73/514.39; 360/113; 338/32 H, 32 R; 174/52.2; 264/272.11, 272.14, 272.15, 272.17; 123/406.58, 617; 188/181 R; 303/138

(56) References Cited

U.S. PATENT DOCUMENTS

| | | | |
|---|---|---|---|
| 4,315,523 | * | 2/1982 | Mahawili et al. ................... 137/486 |
| 4,614,111 | | 9/1986 | Wolff . |
| 4,733,455 | | 3/1988 | Nakamura et al. ................... 360/113 |
| 4,908,685 | * | 3/1990 | Shibasaki et al. ..................... 357/27 |
| 5,021,493 | | 6/1991 | Gonsalves ............................ 324/252 |
| 5,084,289 | | 1/1992 | Lachmann et al. ................... 324/174 |
| 5,121,289 | | 6/1992 | Gagliardi .......................... 324/207.2 |
| 5,210,493 | | 5/1993 | Schroeder et al. .................... 324/252 |
| 5,216,405 | | 6/1993 | Schroedes et al. . |
| 5,250,925 | | 10/1993 | Schinkle . |
| 5,414,355 | | 5/1995 | Davidson et al. . |
| 5,453,727 | * | 9/1995 | Shibasaki et al. ................. 338/32 R |
| 5,488,294 | | 1/1996 | Lidell et al. . |
| 5,491,633 | | 2/1996 | Henry . |
| 5,508,611 | | 4/1996 | Schroeder et al. .............. 324/207.21 |
| 5,581,170 | | 12/1996 | Engel et al. . |
| 5,627,315 | | 5/1997 | Figi et al. . |
| 5,631,557 | | 5/1997 | Davidson ............................. 324/174 |
| 5,712,562 | | 1/1998 | Berg ................................ 324/207.26 |
| 5,818,222 | | 10/1998 | Ramsden .......................... 324/207.2 |

FOREIGN PATENT DOCUMENTS 63-084176 * 4/1988 (JP) .

OTHER PUBLICATIONS

Allegro Microsystems, Inc "Digital Hall–Effect Gear tooth sensors For Your Automotive Applications" Allegro Microsystems, Inc. (date unavailable).

* cited by examiner

*Primary Examiner*—Jay Patidar
(74) *Attorney, Agent, or Firm*—David G. Rasmussen; Arthur K. Hooks; Vincent H. Sweeney

(57) ABSTRACT

A magnetic field sensor assembly has a magnet, a semiconductor sensor and a metal leadframe encapsulated in a plastic package to form a semiconductor integrated circuit. A metal leadframe has a die attach pad on which the sensor is secured and an assembly having one or more projections for securing the magnet in close proximity to the sensor. The leadframe is made from a metal having sufficient spring tension so that the assembly having the projections will secure the magnet. The sensor is adjacent to a ferromagnetic object and will detect a change in magnetic field caused by the ferromagnetic object. Only a thin layer of the plastic package covers the sensor thus reducing the distance between the sensor and the ferromagnetic object but still maintaining an air gap between the plastic package and the ferromagnetic object sufficient to allow passage of the ferromagnetic object.

3 Claims, 6 Drawing Sheets

SINGLE UNITARY PLASTIC PACKAGE FOR A MAGNETIC FIELD SENSING DEVICE

RELATED APPLICATIONS

This application is a continuation of application Ser. No. 08/916,746, now U.S. Pat. No. 5,963,028, filed Aug. 19, 1997.

BACKGROUND OF THE INVENTION

1. Field of the Invention

The present invention generally relates to magnetic field sensitive devices, such as Hall effect sensing devices. More particularly, this invention relates to the assembly and packaging of integrated circuits including a Hall effect sensor die and magnet to reduce the minimum obtainable distance between the sensing device and a ferromagnetic object being sensed.

2. Description of the Related Art

Magnetic sensing devices which can detect the presence of a ferromagnetic object in the vicinity of the sensing device have been widely used. Such sensing devices typically utilize a magnetic field and employ sensing apparatus that detect changes in the strength of a magnetic field. Magnetic field strength is defined as the magnetomotive force developed by a permanent magnet per the distance in the magnetization direction. As an example, an increase in the strength of a magnetic field, corresponding to a drop in the reluctance of a magnetic circuit, will occur as an object made from a high magnetic permeability material, such as iron, is moved toward the magnet. Magnetic permeability is the ease with which the magnetic lines of force, designated as magnetic flux, can pass through a substance magnetized with a given magnetizing force. Quantitatively, it is expressed as the ratio between the magnetic flux density (the number or lines of magnetic flux per unit area which are perpendicular to the direction of the flux) produced and the magnetic field strength, or magnetizing force. Because the output signal of a magnetic field sensing device is dependent upon the strength of the magnetic field, it is effective in detecting the distance between the sensing device and an object within the magnetic circuit. The range within which the object can be detected is limited by the flux density, as measured in gauss or teslas.

Where it is desired to determine the speed or rotational position of a rotating object, such as a disk mounted on a shaft, the object is typically provided with surface features that project toward the sensing device, such as teeth. The proximity of a tooth to the sensing device will increase the strength of the magnetic field. Accordingly, by monitoring the output of the sensing device, the rotational speed of the disk can be determined by correlating the peaks in the sensor's output with the known number of teeth on the circumference of the disk. Likewise, when the teeth are irregularly spaced in a predetermined pattern, the rotational position of the body can be determined by correlating the peak intervals with the known intervals between the teeth on the disk.

One prominent form of such a sensing device is a Hall effect sensor. A Hall effect sensor relies upon a transverse current flow that occurs in the presence of a magnetic field. The Hall effect sensor is primarily driven by a direct current voltage source having electrodes at both ends of the Hall effect sensor, creating a longitudinal current flow through the sensor's body. In the presence of a magnetic field, a transverse current is induced in the sensor which can be detected by a second pair of electrodes transverse to the first pair. The second pair of electrodes can then be connected to a voltmeter to determine the potential created across the surface of the sensor. This transverse current flow increases with a corresponding increase in the magnetic field's strength.

The Hall effect sensor is mounted within and perpendicular to a magnetic circuit which includes a permanent magnet and an exciter. The exciter is a high magnetic permeability element having projecting surface features which increase the strength of the magnet's magnetic field as the distance between the surface of the exciter and the permanent magnet is reduced. Typically, the exciter will be in the form of a series of spaced teeth separated by slots, such as the teeth on a gear. The exciter moves relative to the stationary Hall effect sensor element, and in doing so, changes the reluctance of the magnetic circuit so as to cause the magnetic flux through the Hall effect element to vary in a manner corresponding to the position of the teeth. With the change in magnet flux there occurs the corresponding change in magnetic field strength, which increases the transverse current of the Hall effect sensor.

With the increasing sophistication of products, magnetic field sensing devices have also become common in products that rely on electronics in their operation, such as automobile control systems. Common examples of automotive applications are the detection of ignition timing from the engine crankshaft and/or camshaft, and the detection of wheel speed for anti-lock braking systems and four wheel steering systems. For detecting wheel speed, the exciter is typically an exciter wheel mounted inboard from the vehicle's wheel, the exciter wheel being mechanically connected to the wheel so as to rotate with the wheel. The exciter wheel is provided with a number of teeth which typically extend axially from the perimeter of the exciter wheel to an inboard-mounted magnetic field sensor. As noted before, the exciter wheel is formed of a high magnetic permeability material, such as iron, such that as each tooth rotates toward the sensor device, the strength of the magnetic field increases as a result of a decrease in the magnetic circuit's reluctance. Subsequently, the magnetic circuit reluctance increases and the strength of the magnetic field decreases as the tooth moves away from the sensing device. In the situation where a Hall effect device is used, there will be a corresponding peak in the device's potential across the transverse electrodes as each tooth passes near the device.

A common shortcoming of magnetic field sensing devices is their output's dependence upon the distance between the exciter and the sensing device, known as the air gap. More specifically, as the air gap increases, the maximum output range of the device decreases thus decreasing the resolution of the output and making it more difficult to accurately analyze the device's output. The output of a Hall effect device is directly proportional to the strength of the magnetic field, and therefore is sensitive to the air gap at low strength magnetic fields.

Conventionally, the air gap is defined as the distance between the exciter and the outer surface of the package containing the sensing device. An "effective air gap" may be described as the distance between the exciter and the sensing device itself. As can be seen in FIG. 1, the prior art magnetic field sensors 10 typically include a permanent magnet 14 and sensing device 16 encapsulated in a package 18. However, this type of packaging is unsuited for harsh environments, particularly that of an automobile. As a result, such packaged sensing devices are further enclosed in an additional housing (overmold) 20 which affords protection from moisture and dirt. Accordingly, while the sensing device's air gap 22, the distance between the exciter and the sensing device's package may be unchanged, the sensing device's effective air gap 24, the distance between the exciter and the sensing device itself, may be increased significantly. Thus, while improving the life of the sensing device, a particularly significant shortcoming to this approach is the decrease in the peak magnetic field strength as a tooth passes in proximity to the sensing device due to the larger effective air gap. In addition a variety of steps are required to assemble the numerous components of this assembly. Still another problem is that it is desirable to have the sensing device 16 as close as possible to the magnet 14 because the magnetic field decreases as a function of air gap. Being closer allows the use of a smaller or lower energy product magnet.

Thus, it would be desirable to provide a packaging scheme for a magnetic field sensing device, such as a Hall effect device, that would provide reliable protection from the environment while also avoiding an excessive increase in the effective air gap between the sensing device and the exciter, reduce the number of assembly steps, and allow the sensing device to be as close as possible to the magnet.

SUMMARY OF THE INVENTION

An integrated circuit magnetic field sensor assembly includes a magnet, a sensor and a metal leadframe encapsulated in an plastic package. The magnet creates a magnetic field. A semiconductor sensor is located within the magnetic field for sensing the strength of the magnetic field. The sensor allows the detection of a ferromagnetic object passing through the magnetic field. The metal leadframe has a die attach pad on which the sensor is secured and an assembly for securing the magnet in close proximity to the sensor. The assembly for securing the magnet may be a pair of retaining fingers formed from spring like projections of the lead frame which grip the magnet. The magnet, sensor and leadframe are encapsulated in a plastic package to form a semiconductor integrated circuit in which a thin layer of the plastic package covers the sensor. The sensor is adjacent to the ferromagnetic object and is positioned from the ferromagnetic object so as to reduce the distance between the sensor and the ferromagnetic object and still maintain an air gap between the plastic package and the ferromagnetic object to allow passage of the ferromagnetic object. In the preferred embodiment the sensor is a Hall effect device which may have one or more Hall effect elements to detect edges of the ferromagnetic object such as a gear tooth.

One inventive feature is the fabrication and encapsulation of the magnetic field sensor as an integrated circuit so that only a thin portion of the plastic package covers the Hall effect cell elements sensor die and the effective air gap between the die and the exciter is minimized which allows manufacturers or end users greater flexibility in design since they can balance the needs for improved resolution of the sensing device and the need to have a certain minimum gap to compensate for the unevenness of gears caused by heat expansion, uneven teeth and wear on the gear.

A second inventive feature is the use of retaining fingers on the leadframe to secure the magnet such that it is separated from the Hall cell elements sensor die only by the die attach pad which thus allows for closer proximity of the Hall cell elements sensor die and magnet. Fingers also provide accurate location to center the magnetic field and provide rigidity during transfer to the encapsulation mold. The fingers also keep the magnet against the lead frame so as to not increase the gap between the magnet and sensor. Additionally, the fingers simplify the assembly process since no adhesive and attendant curing step is needed and no other additional fasteners are needed. Still another feature is that the fingers are compliant and accommodate the size and shape of the magnet which reduces the need for critical part sizes and tolerances. All of these features reduce the cost of the product.

A third inventive feature is that the structure of the leadframe, Hall cell elements sensor die and magnet allow the integrated circuit Hall effect sensor unit to be fabricated as one plastic encapsulated integrated circuit manufactured on an industry standard integrated circuit assembly and plastic encapsulation process. This makes the sensor device less costly because of less manufacturing steps and provides a complete plastic package around all elements of the magnetic sensor unit thus providing better environmental protection against dust, dirt, corrosives and engine fluids.

DETAILED DESCRIPTION OF THE INVENTION

Figure 1:
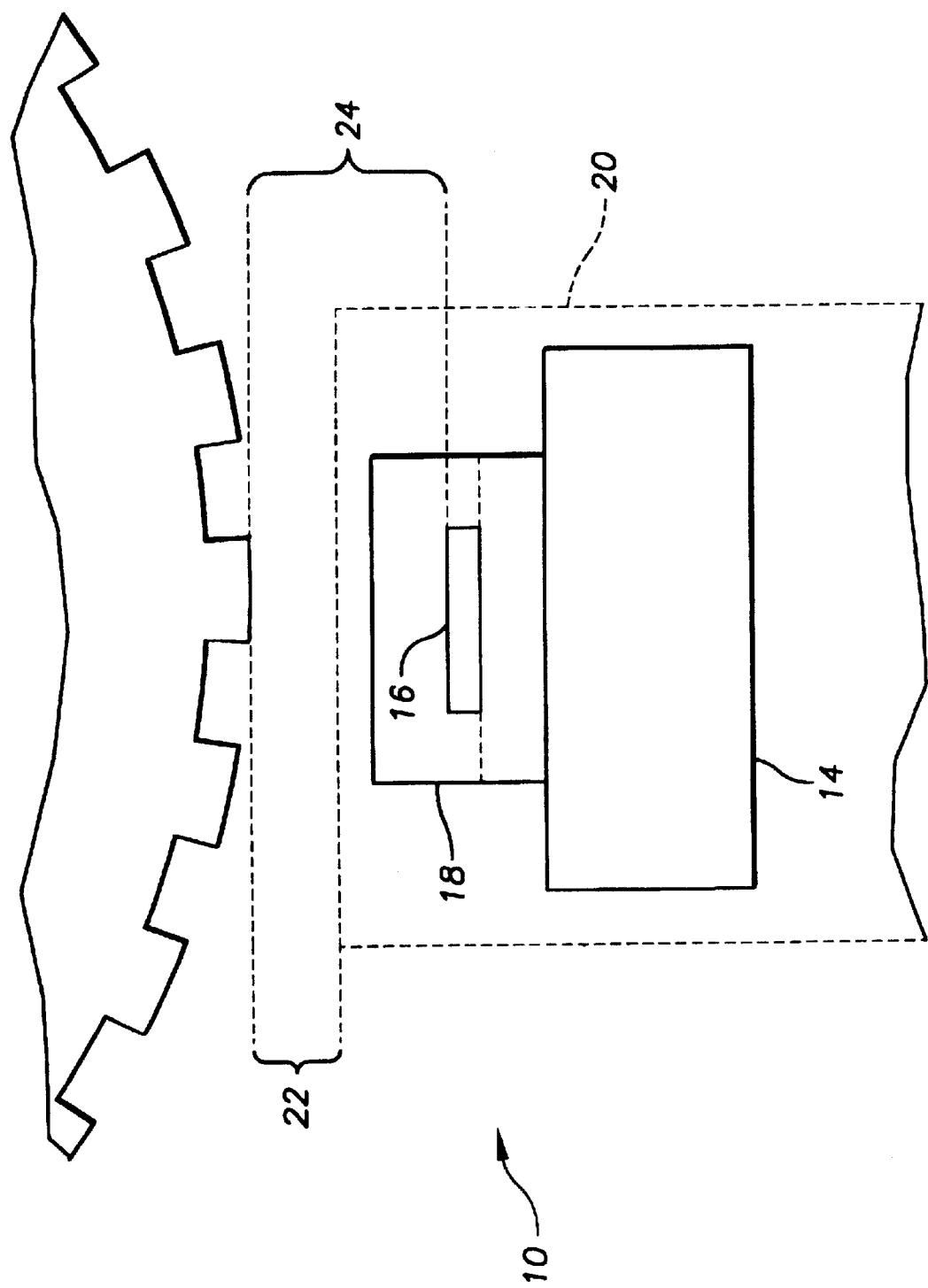
FIG. 1 is a diagrammatic view of the structure of a prior art magnetic field sensing device.
Figure 2:
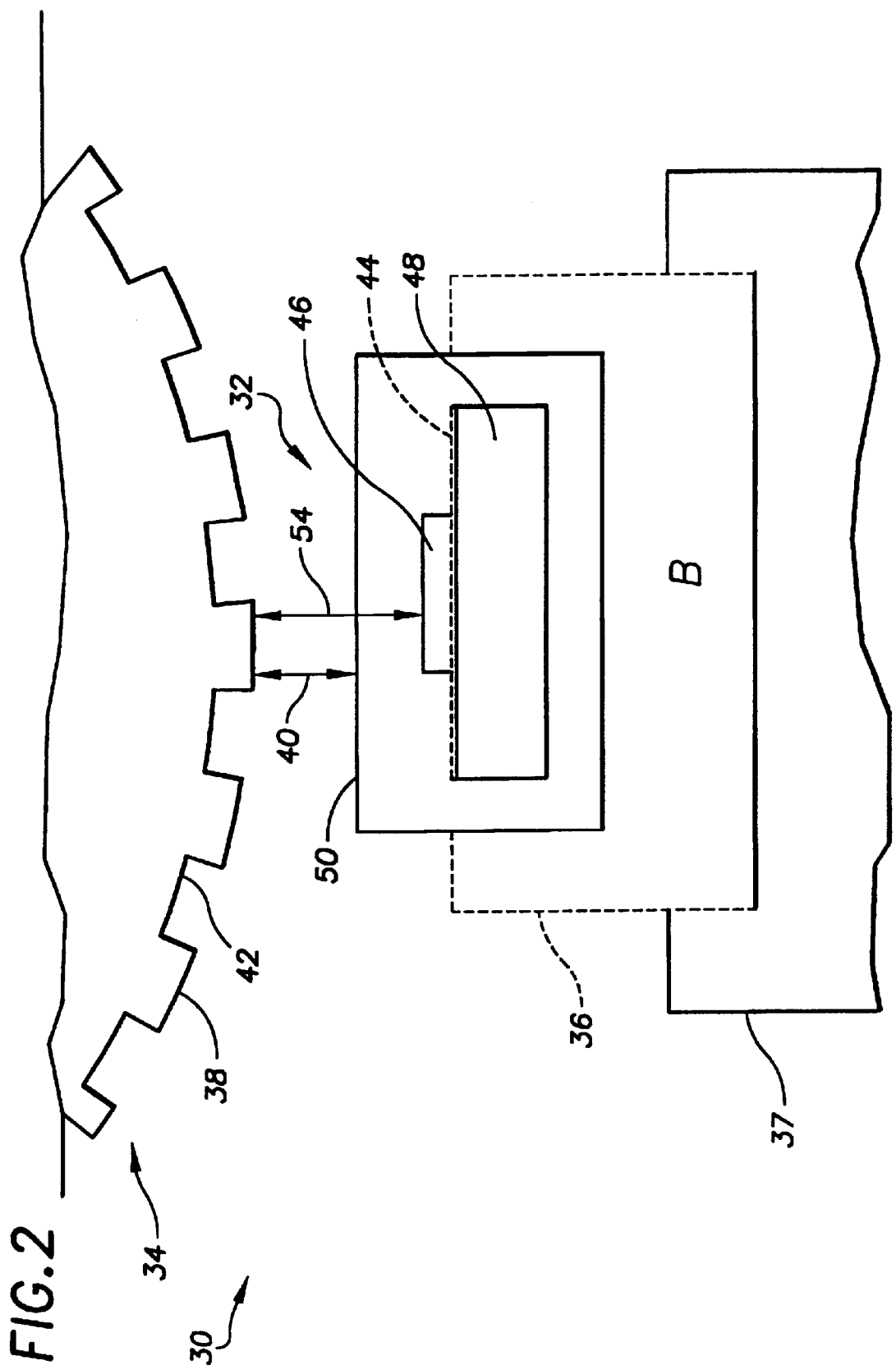
FIG. 2 is a diagrammatic view or the structure of the magnetic field sensor of the present invention.

The present invention is particularly suitable for automotive applications, such as magnetic field sensing devices for detecting the wheel speed for an electronic antilock braking system. For descriptive purposes, the magnetic field sensing device 30 illustrated in FIG. 2 is depicted as a integrated circuit Hall effect sensor unit 32 that is used to detect the rotational speed of a toothed exciter wheel 34 for automotive anti-lock braking system (not shown). The exciter wheel 34 is rotatably mounted in the wheel housing of a vehicle equipped with an anti-lock braking system. The exciter wheel 34 is engaged for rotation with one of the automobile's wheels, the rotational speed of which is required for feedback to the anti-lock circuitry to prevent complete lockup of the wheel during braking.

Referring specifically to FIG. 2, the integrated circuit Hall effect sensor unit 32 is secured within a overmold 36 which is mounted adjacent the exciter wheel 34 for the purpose of locating the integrated circuit Hall effect sensor unit 32 near the exciter wheel 34. The overmold 36 can be of any suitable shape and construction, and may be adapted for example to be mounted in an engine block 37. The overmold 36 is located radially from the exciter wheel 34 so as to position the integrated circuit Hall effect sensor unit 32 a predetermined distance from a series of teeth 38 formed on the exciter wheel perimeter. This distance is termed the air gap 40, which is of primary interest for purposes of the present invention. Generally, air gap 40 will be dependent upon the particular application and the result of the tolerances of the hardware used. Air gaps of 0.5 to 2.0 millimeters are not unusual, such as with the embodiment illustrated in FIG. 2.

Between each tooth 38 is a slot 42 which clearly delineates adjacent teeth 38. Generally, the teeth 38 are evenly spaced by the slots 42 around the periphery or circumference of the exciter wheel 34 and are substantially identical in size and shape. The overmold 36 is fixed in a stationary position adjacent the teeth 38 of the exciter wheel 34 so that the teeth 38 and slots 42 alternately pass the integrated circuit Hall effect sensor unit 32 as the wheel of the automobile rotates.

Looking further at FIG. 2, the integrated circuit Hall effect sensor unit 32 has a leadframe 44, a Hall cell elements sensor die 46 bonded to the upper face of leadframe 44 and a permanent magnet 48 mounted flush with the bottom face of leadframe 44. The die 46 could have a single centered Hall cell element or multiple elements for example two Hall effect sensors which could be spaced 0.088 inches apart. These sensors form an edge detector to detect the passage of the edges of teeth 38. The entire assembly of the leadframe 44, die 46, and magnet 48 is then packaged in a plastic package 50 by a conventional transfer molding plastic packaging process. This entire assembly forms an integrated circuit Hall effect sensor unit 32 which is generic in nature and may be used in a variety of applications with overmold 36 providing the means for mounting in each application as previously described.

Together, the exciter wheel 34 and the permanent magnet 48 define a magnetic circuit. The permanent magnet 48 is oriented with its poles aligned with the exciter wheel 34, and the Hall cell elements sensor die 46 is positioned within the integrated circuit Hall effect sensor unit 32 so that the resulting magnetic field is perpendicular to the integrated circuit Hall effect sensor unit 32. With this spatial relationship between the components of the magnetic circuit, the presence of a tooth 38 of the exciter wheel 34 adjacent the Hall cell elements sensor die 46 causes an increase in the magnetic flux of the magnetic circuit, which lowers the circuit's reluctance and thus affects the integrated circuit Hall effect sensor unit 32 output as the exciter wheel 34 rotates.

The overmold 36 holds the integrated circuit Hall effect sensor unit 32 in the exact location so as to be properly spaced from exciter 34. Air gap 40 is the distance between the edge of plastic package 50 and exciter 34. The effective air gap 54 is the distance between Hall cell elements sensor die 46 and exciter 34. The plastic package 50 provides complete protection against all environmental hazards such as moisture, corrosives, dust, dirt and oil, since it completely covers the entire assembly of the Hall cell elements sensor die 46, leadframe 44 and permanent magnet 48. The effective air gap 54 is reduced in size because only one layer of plastic being of the minimum thickness necessary to provide protection is between die 46 and exciter 34.

The reduction in the layer of plastic between die 46 and exciter 34 is important for several reasons. Because of heat expansion, uneven gears, wear and other factors it is desirable to keep the air gap as large as possible to compensate for the uneven gears. At the same time sensitivity can be increased for the magnetic field sensor as a whole if the air gap 40 is minimized and the effective air gap 54 is decreased. Having the thinnest layer of plastic possible covering the surface of the die 46 allows the automobile manufacturers more flexibility in designing the sensor to balance the needs for compensating for uneven gears and to get better sensitivity.

Figure 3:
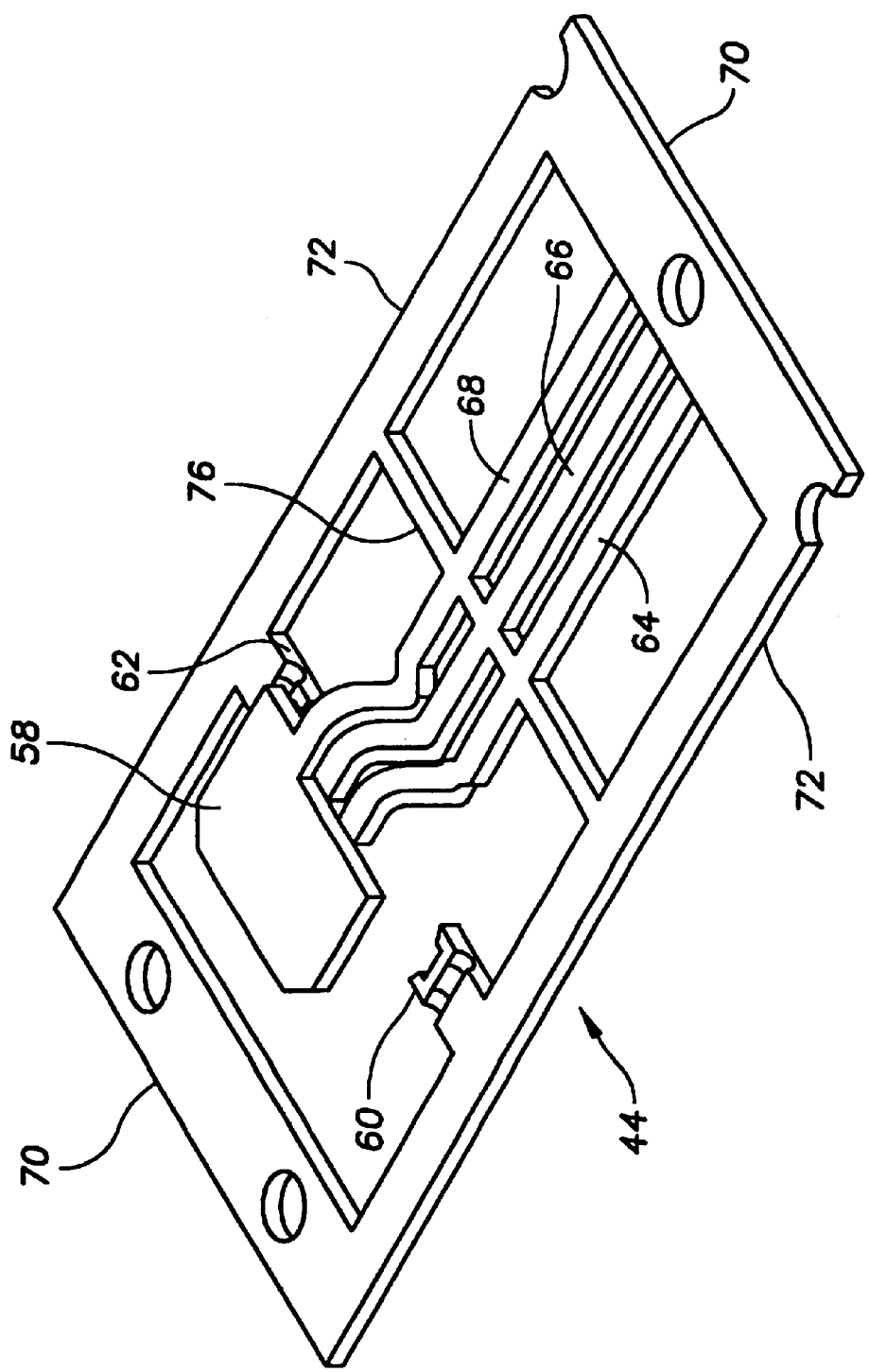
FIG. 3 is a perspective top view of the lead frame of the magnetic field sensor of FIG. 2.

FIG. 3 is a perspective view of metal leadframe 44 shown in FIG. 2 having a die attach pad 58 for receiving Hall cell elements sensor die 46, retaining fingers 60,62 for mounting magnet 48 and package leads 64,66,68. Rails 70, side rails 72 and tie bars 76 complete a segment of the leadframe 44. A continuous set of identical segments will form a leadframe strip used in a typical integrated circuit assembly process. Leadframe 44 may be, for example, made of a non-magnetic three quarter to full hard copper alloy CDA 151 to give it enough spring to allow retaining fingers 60,62 sufficient tension to hold magnet 48. The leadframe must be soft enough to bend but hard enough to hold its shape for the assembly process. Hall cell elements sensor die 46 may be attached to die attach pad 58 with a conductive epoxy or polyimide adhesive. Typically an anti-lock braking system would be a two lead package whereas an ignition system would be a four lead package, depending on the device type used.

Figure 4:
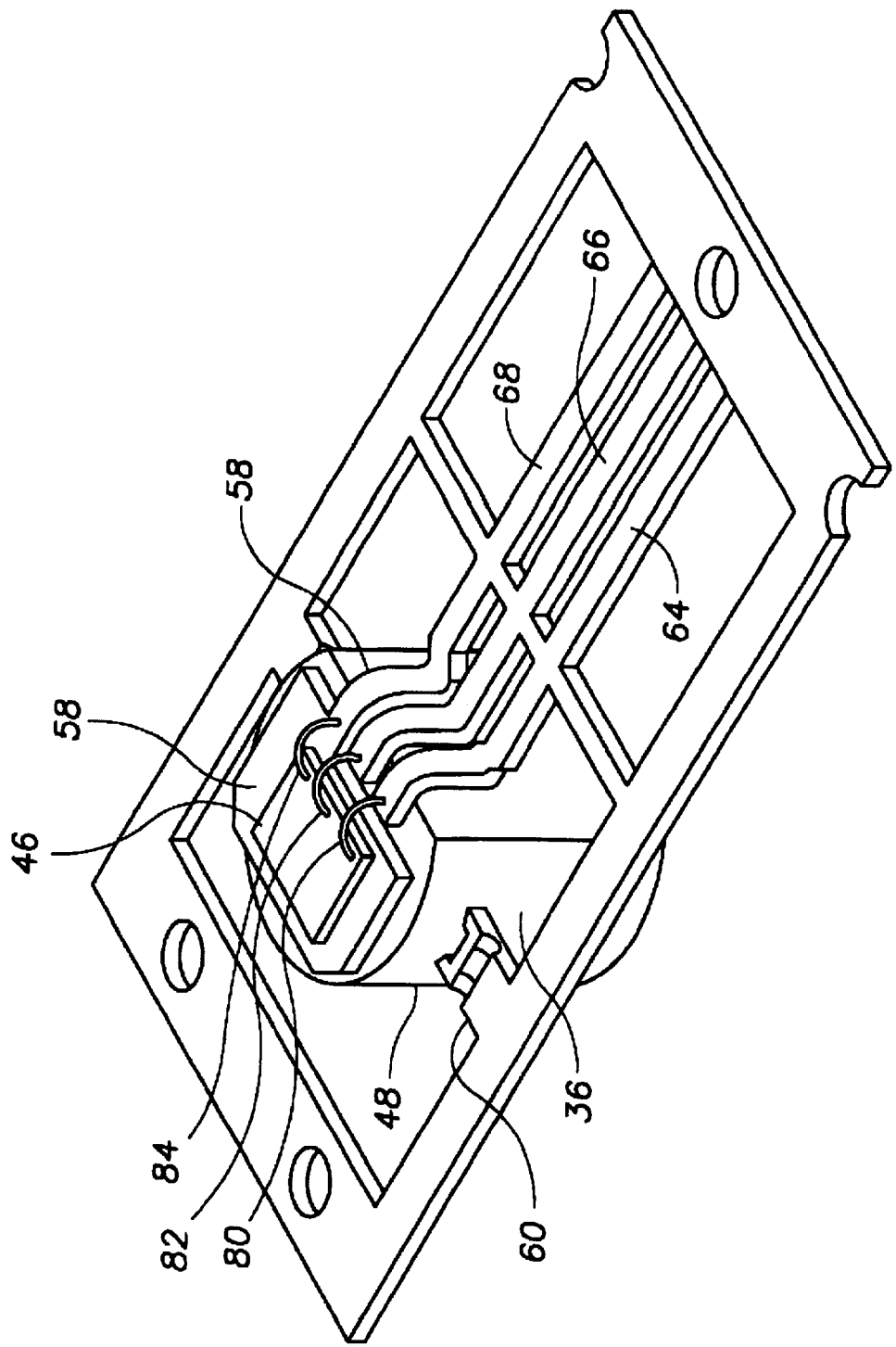
FIG. 4 is a perspective top view of the leadframe of FIG. 3 after the next assembly step of adding a die, magnet and bon wires to the leadframe.

FIG. 4 shows leadframe 44 in the next step of the assembly process with Hall cell elements sensor die 46 attached to die attach pad 58 and magnet 48 secured by the spring tension of retaining fingers 60,62. Hall cell elements sensor die 46 has a minimum of three bond pads which are connected by gold bond wires 80,82,84 to package leads 64,66,68 respectively. Leadframe 44, Hall cell elements sensor die 46 and magnet 48 form the leadframe assembly that will be encapsulated in plastic by a transfer molding process. Package leads 64, 66, 68 provide the signal output for the integrated circuit.

Figure 5:
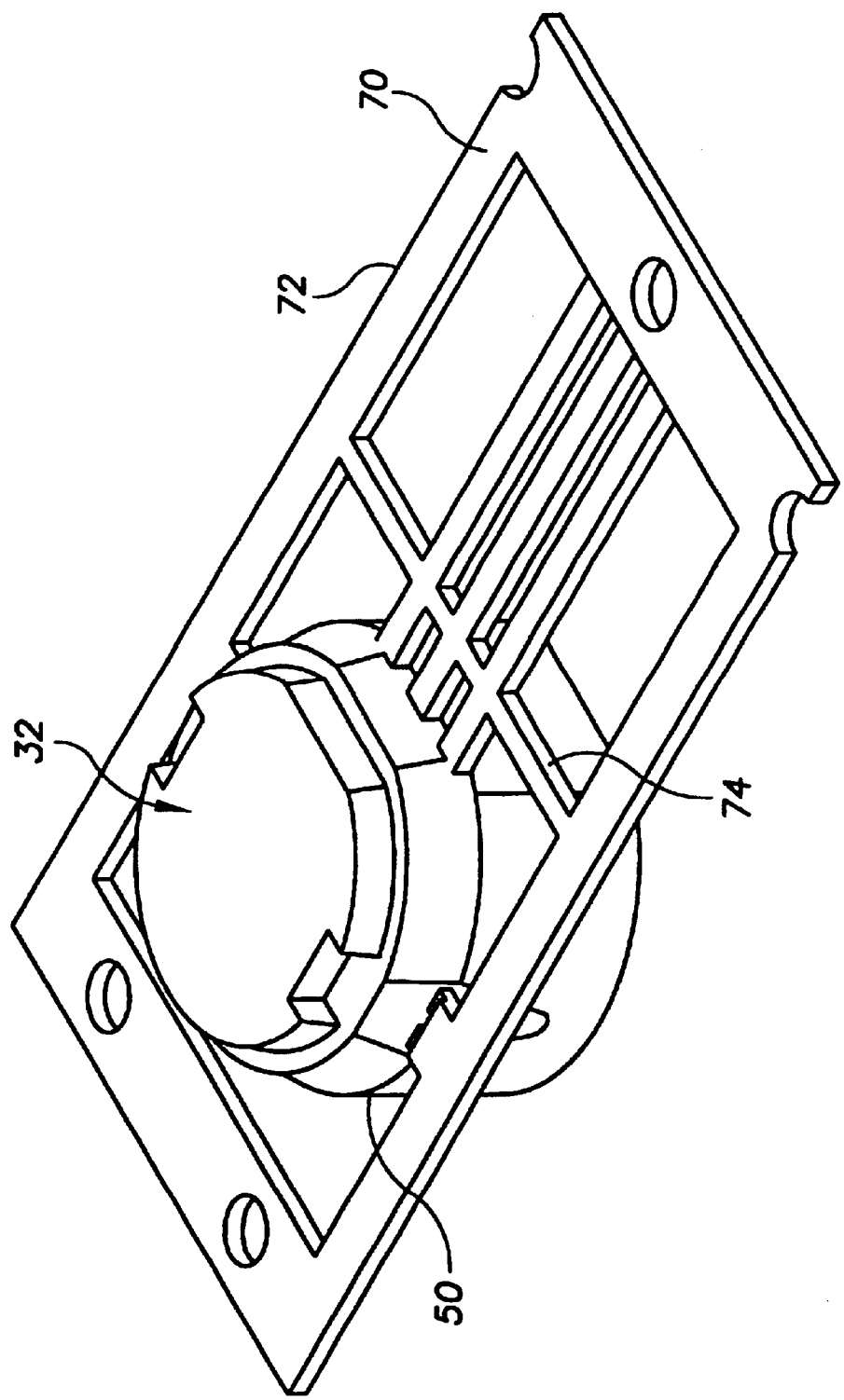
FIG. 5 is a perspective top view of an integrated circuit formed by transfer molding the leadframe of FIG. 4.

FIG. 5 shows a perspective view of the integrated circuit Hall effect sensor unit 32 after the Hall cell elements sensor die 46, leadframe 44 and permanent magnet 48 have been encapsulated in plastic package 50 by the transfer molding process.

Figure 6:
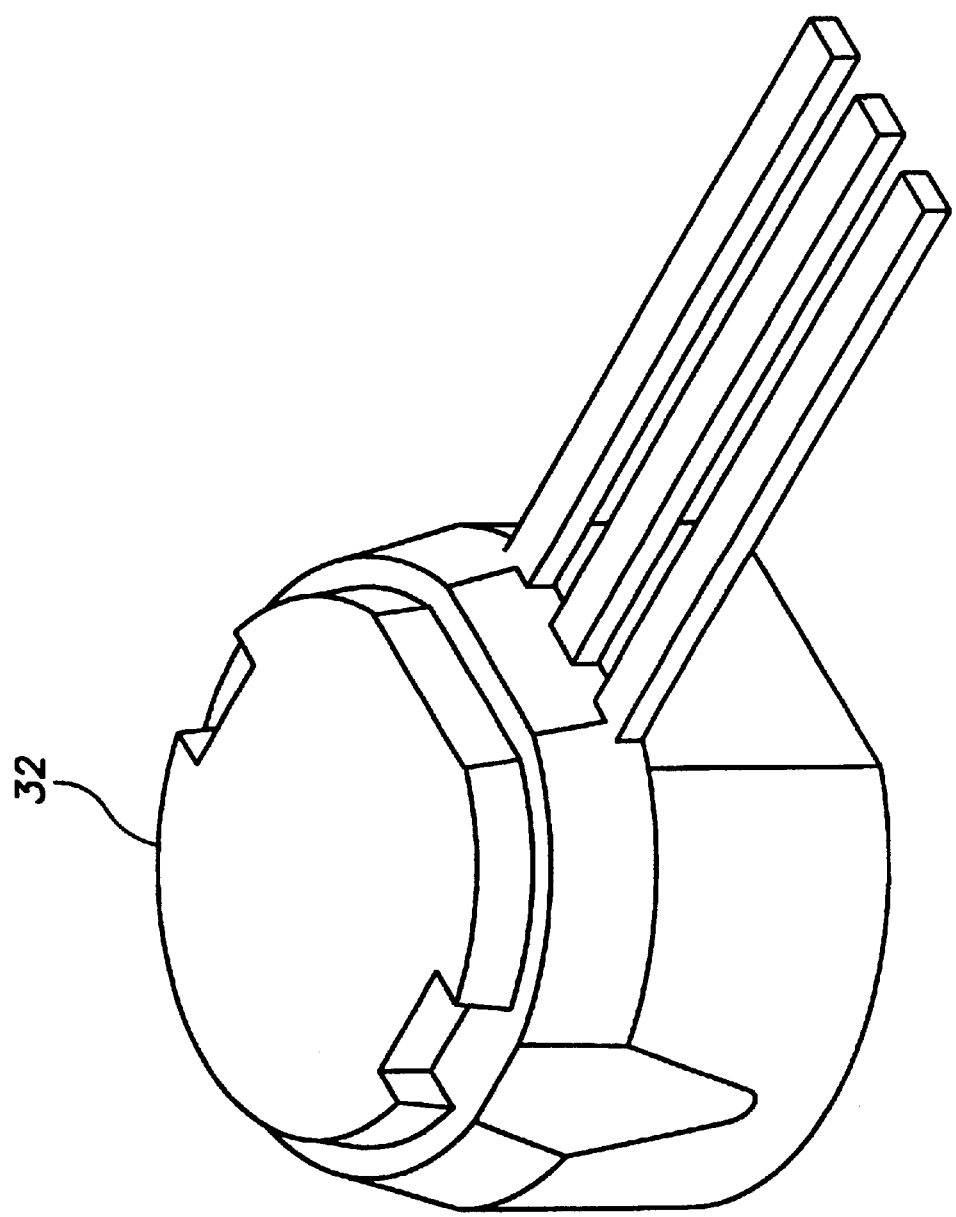
FIG. 6 is a perspective top view of the integrated circuit of FIG. 5 with the leadframe trimmed off.

FIG. 6 shows the integrated circuit Hall effect sensor unit 32 after rails 70, tie bars 72 and dam bars 74 have been trimmed off and package leads 64, 66, 68 are extending from the package. This is the final step in the integrated circuit assembly and encapsulation process.

The improved operation of the magnetic field sensing device 30 is as follows. The arrangement of the permanent magnet 48 with the exciter wheel 34 sets up a magnetic circuit therebetween, creating a magnetic field with a predetermined magnetic flux whose density is dependent upon the upon the magnetic strength of the magnetic circuit. The magnetic flux of the magnetic circuit extends between the poles of the permanent magnet 48, one of which will be the south pole while the other is the north pole. The poles are oriented to be perpendicular to the integrated circuit Hall effect sensor unit 32, such that one of the poles is disposed near it while the other pole is displaced from it. A large percentage of the magnetic flux is contained within a loop which can be traced from the pole furthest from the integrated circuit Hall effect sensor unit 32, across a large air gap between the this pole and the exciter wheel 34 and back through the air gap 40 to the pole nearest the integrated circuit Hall effect sensor unit 32. The rotation of the exciter wheel 34 produces cyclical fluctuation in the reluctance of the magnetic circuit which thereby causes a corresponding fluctuation in the strength of the magnetic field sensed by the integrated circuit Hall effect sensor unit 32. The transverse current of the Hall effect sensor unit integrated circuit 34 increases with an increase in the strength of the magnetic field corresponding to a tooth 38 being in proximity to the integrated circuit Hall effect sensor unit 32, and decreases with an decrease in the strength of the magnetic field corresponding to slot 42 being in proximity to the Integrated circuit Hall effect sensor unit 32. The magnetic field sensing device 30 is an edge detector and senses each edge of each tooth 38. Accordingly, knowing the number of teeth 38 in the exciter wheel 34 and the fact that the Hall effect die has two sensors for detecting edges the Hall effect sensor can be used to determine the speed at which the wheel is rotating.

Accordingly, one inventive feature is the fabrication and encapsulation of the magnetic field sensor as an integrated circuit so that only a thin portion of the plastic package 50 covers the Hall effect cell elements sensor die 46 and the effective air gap 54 between the die 46 and the exciter 34 is minimized. This allows the manufacturer greater flexibility in design since they can balance the needs for improved resolution of the sensing device and the need to have a certain minimum gap to compensate for the unevenness of gears caused by heat expansion, uneven teeth and wear on the gear.

A second inventive feature is the use of retaining fingers 60, 62 on the leadframe 44 to secure the magnet 48 such that it is separated from the Hall cell elements sensor die 46 only by the die attach pad 58. This allows for tight tolerance from the magnet face to the Hall cell elements sensor die. The advantage is that by maintaining a fixed distance, the variations in the field is much lower, allowing for a much more consistent product. Fingers 60, 62 also provide accurate location to center the magnetic field and provide rigidity during transfer to the encapsulation mold. Additionally, the fingers simplify the assembly process since no adhesive and attendant curing step is needed and no other additional fasteners are needed. Still another feature is that the fingers are compliant and accommodate the size and shape of the magnet which reduces the need for critical part sizes and tolerances. All of these features reduce the cost of the product.

A third inventive feature is that the structure of the leadframe 44, Hall cell elements sensor die 46 and magnet 48 allows the integrated circuit Hall effect sensor unit 32 to be fabricated as one plastic encapsulated integrated circuit manufactured on an industry standard integrated circuit assembly and plastic encapsulation process. This makes the sensor device less costly because of less manufacturing steps and provides a complete plastic package around all elements of the integrated circuit Hall effect sensor unit 32 thus providing better environmental protection against dust, dirt, corrosives and engine fluids.

It should be noted that it is within the scope of this invention to use a magnetoresistor as a magnetic field sensing device. A magnetoresistor is a device whose resistance varies with the strength of the magnetic field applied to the device. Generally, the magnetoresistor is a slab of electrically conductive material, such as a metal or a semiconductor. For many automotive applications, the preferred form of a magnetoresistor is a thin elongate body of a high carrier mobility semiconductor material, such as indium antimonide (InSb) or indium arsenide (InAs), having contacts at its ends. The magnetoresistor is mounted within and perpendicular to a magnetic circuit which includes a permanent magnet and an exciter. The exciter moves relative to the stationary magnetoresistor element, and in doing so, changes the reluctance of the magnetic circuit so as to cause the magnetic flux through the magnetoresistor element to vary in a manner corresponding to the position of the teeth of the exciter. With the change in magnet flux there occurs the corresponding change in magnet field strength, which increases the resistance of the magnetresistor.

While the preferred embodiments of the invention have been shown and described, numerous variations and alternative embodiments will occur to those skilled in the art. Accordingly, it is intended that the invention be limited only in terms of the appended claims.

What is claimed is:

1. A magnetic field sensor comprising:
   a) a magnet for creating a magnetic field, said magnet having a magnetic pole at one end thereof;
   b) a semiconductor sensor die located within said magnetic field for sensing the strength of said magnetic field;
   c) a metal leadframe having a die attach pad, said sensor die being attached to one side of said die attach pad, said one end of said magnet being attached essentially flush against the other side of said die attach pad; said magnet, sensor die and leadframe comprising a subassembly, said subassembly having been encapsulated by a single transfer-molding step.

2. The magnetic field sensor of claim 1 wherein said magnet is held attached to said die attach pad by at least two finger-like spring loaded projections of said leadframe.

3. The magnetic field sensor of claim 1 wherein said magnet is held attached to the other side of said die attach pad by a cured adhesive between said one pole end of said magnet and said other die-attach-pad side.

* * * * *

UNITED STATES PATENT AND TRADEMARK OFFICE
CERTIFICATE OF CORRECTION

PATENT NO. : 6,265,865 B1
DATED : July 24, 2001
INVENTOR(S) : Engel et al.

It is certified that error appears in the above-identified patent and that said Letters Patent is hereby corrected as shown below:

Column 3,
Line 29, delete "an" and replace with -- a plastic --.

Column 4,
Line 29, delete "bon wires" and replace with -- bond wires --.
Line 42, delete "as a integrated" and replace with -- as an integrated --.
Line 53, delete "a overmold" and replace with -- an overmold --.

Column 6,
Line 52, delete "the this" and replace with -- this --.
Line 63, delete "an decrease" and replace with -- a decrease --.
Line 64, delete "Integrated" and replace with -- integrated --.

Signed and Sealed this

Twenty-first Day of May, 2002

*Attest:*

*Attesting Officer*

JAMES E. ROGAN
*Director of the United States Patent and Trademark Office*